(12) United States Patent
Duane et al.

(10) Patent No.: US 6,310,799 B2
(45) Date of Patent: Oct. 30, 2001

(54) NEGATIVE RESISTANCE DEVICE

(75) Inventors: Russell Duane; Alan Mathewson; Ann Concannon, all of Cork (IE)

(73) Assignee: National University of Ireland, Cork, Cork (IE)

( * ) Notice: Subject to any disclaimer, the term of this patent is extended or adjusted under 35 U.S.C. 154(b) by 0 days.

(21) Appl. No.: 09/742,214

(22) Filed: Dec. 22, 2000

(30) Foreign Application Priority Data

Dec. 22, 1999 (IE) .......................................... 991082

(51) Int. Cl.[7] ................................................ G11C 11/00
(52) U.S. Cl. .......................... 365/159; 365/175; 365/177; 365/71
(58) Field of Search .............................. 365/159, 175, 365/179, 177, 71, 148

(56) References Cited

U.S. PATENT DOCUMENTS

| | | | |
|---|---|---|---|
| 3,974,486 | 8/1976 | Curtis et al. | 340/173 |
| 5,060,194 | 10/1991 | Sakui et al. | 365/177 |
| 5,594,683 | 1/1997 | Chen et al. | 365/177 |
| 5,883,829 | * 3/1999 | van der Wagt | 365/159 |

FOREIGN PATENT DOCUMENTS

402262361A- * 10/1990 (JP) ............................. H01L/27/10

* cited by examiner

Primary Examiner—David Nelms
Assistant Examiner—David Lam
(74) Attorney, Agent, or Firm—Jacobson Holman, PLLC

(57) ABSTRACT

A negative resistance device (NRD) has a MOSFET-like structure, and is biased by shorting the gate and source together at a fixed applied potential and applying a different fixed potential to the drain, and sweeping the bulk potential towards the drain potential, causing the bulk current to exhibit a negative resistance characteristic. The NRD may be used in a memory circuit (10) in which a resistor (R) is connected between the bulk (2) and a fixed potential. Two States of the circuit at which the current through the resistor matches that through the bulk of the NRD are stable, providing for bistable memory operation.

14 Claims, 7 Drawing Sheets

NEGATIVE RESISTANCE DEVICE

FIELD OF THE INVENTION

The invention relates to electronic circuit memories.

PRIOR ART DISCUSSION

At present, the two primary volatile memory technologies in use are Dynamic Random Access Memory (DRAM) and Static Random Access Memory (SRAM).

Dynamic Random Access Memory (DRAM) is a volatile random-access memory that stores information as a charge on a capacitor. This capacitor leaks charge with time and hence the memory needs to be periodically refreshed by the peripheral circuitry to retain its memory content. DRAM memories cannot match the speed of the central processor unit (CPU) due to charging current limits (during memory read/write operations) and destructive reading which necessitates rewrite operation. However, DRAM is the least expensive semiconductor memory available on the market today and hence is used in most computers as the core memory. DRAM cells consist of one transistor and one capacitor.

Static Random Access Memory (SRAM) is as fast as the CPU and is capable of storing a memory state as long as power is supplied to the computer. However, this added functionality is area-intensive because SRAM memory cells consist of either four or six CMOS transistors. SRAM memories are used as high-speed cache memories in computers.

There is therefore a requirement for a memory technology which has the advantages of SRAM, but is simpler and less expensive.

One prior approach to providing such a memory involves use of such negative resistance characteristics, and U.S. Patent No. U.S. Pat. No. 3,974,486 describes a Metal Oxide Semiconductor Field Effect Transistor (MOSFET) which exhibits two-terminal negative resistance characteristics. By virtue of a bias voltage controlled, negative resistance region, bistable action is obtained with a single device in conjunction with a resistive element. However, because the device uses the on-state of the FET where the threshold voltage of the device is exceeded to generate negative resistance, there is a standby power consumption in the order of $\mu W$ for the device. Another problem is that oxide is degraded over time because of injection of a significant number of hot carriers into the oxide. Another NRD using a bipolar structure using the reverse base current phenomenon to generate negative resistance is described in U.S. Pat. No. 5,060,194 (Sakai). However, standby power is excessive and in the order of $\mu W$ to $\mu W$ and this prevents this device from large scale integration. A development to this device is described in U.S. Pat. No. 5,594,683 (Chen). This uses a gated lateral bipolar device structure which reduces the power consumption in comparison with the bipolar device of Sakui. However, the standby power consumption in this device is still of the order of $\mu W$.

SUMMARY OF THE INVENTION

According to the invention, there is provided a negative resistance device comprising:

a semiconductor structure comprising a semiconductor region of one conductivity type termed the bulk, a semiconductor region of second conductivity type termed the source wholly or partially contained in the bulk, a semiconductor region of second conductivity type termed the drain wholly or partially contained in the bulk and a gate region over at least part of the bulk and being insulated from the bulk;

a bias means comprising means for biasing the structure to exhibit negative resistance characteristics, in which:

the source and the gate are each held at a fixed applied potential with respect to to a bulk initial bias and the gate to source applied potential difference is not is not greater than the threshold voltage of the structure;

the drain is held at a fixed applied potential which is of greater magnitude than both the gate applied potential and the source applied potential; and a variable bias potential is applied to the bulk so that as it is swept towards the source applied potential the bulk current exhibits a negative resistance characteristic.

In one embodiment, the source and the gate have the same applied voltage.

In another embodiment, the semiconductor structure is a MOSFET structure.

In a further embodiment, the structure is fabricated using silicon-on-insulator techniques.

In one embodiment, source doping is equivalent to doping in the bulk so that lateral bipolar current gain is unity.

In another embodiment, the gate is of polysilicon material and is doped with an equivalent level to that of the source.

According to another aspect, the invention provides a memory circuit comprising (a) a negative resistance device as claimed in any preceding claim; and (b) an element which exhibits a positive resistance characteristic connected between the bulk of the device and a terminal having a fixed potential so that two states of the memory circuit at which the current through the resistor matches that through the bulk of the device are stable states for bistable memory operation.

In one embodiment, the bias means comprises an access transistor for the bulk terminal.

In another embodiment, the source diode of the access transistor acts as the positive resistance element In a further embodiment, the access transistor is of the type having a source, a drain, a gate, and a bulk, the circuit further comprises a load transistor providing a resistive load line, and the source of the access transistor also acts as the bulk of the negative resistance device and the drain of the load transistor.

In one embodiment, said circuit is fabricated on a substrate having a conductivity type different from that of the bulk of the negative resistance device.

In another embodiment, said circuit is fabricated using Silicon On Insulator Techniques.

In a further embodiment, the means of biasing the bulk of the negative resistance device are different from the means of detecting the stored potential in the memory.

Preferably, the means for reading the stored potential is a gain stage.

DETAILED DESCRIPTION OF THE INVENTION

BRIEF DESCRIPTION OF THE DRAWINGS

The invention will be more clearly understood from the following description of some embodiments thereof, given by way of example only with reference to the accompanying drawings in which.

DESCRIPTION OF THE EMBODIMENTS

Figure 1A:
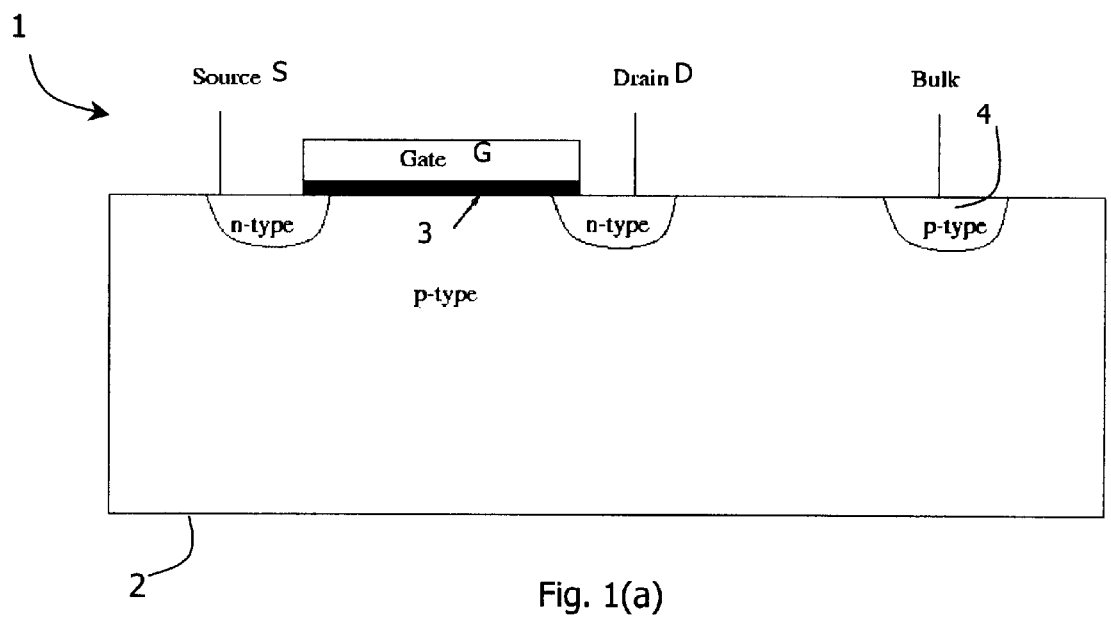
FIG. 1(a) is a schematic elevational view showing the physical structure of a negative resistance device of the invention.
Figure 1B:
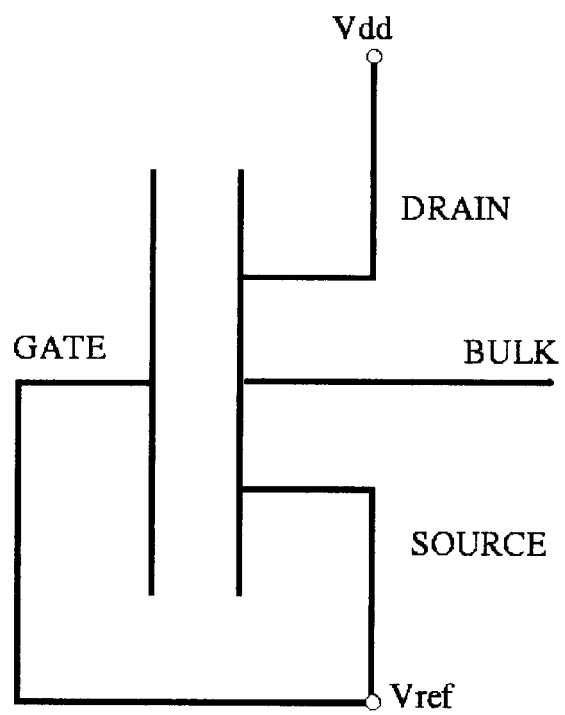
FIG. 1(b) is a circuit representation.

Referring to FIG. 1(a) and 1(b), a negative resistance device (NRD), of the invention comprises a MOSFET structure 1 and a bias means, not shown. In this embodiment, the device has a p-type bulk region, however, it may alternatively have an n-type bulk region with appropriate changes to the polarity of the dopants in the structure and the applied biases. Of course, for an n-type bulk region the word "positive" should be replaced with the word "negative" in the following description.

The NRD physical structure is similar to that of a MOSFET. It comprises a bulk 2 of p-type material and source (S) and drain (D) regions of n-type material fully or partially contained in the bulk. A gate region G of n type polysilicon is insulated from the bulk by a dielectric material 3 of silicon dioxide material. The gate region G extends over the source S and the bulk 2 which includes the junction between the bulk and the source regions. The structure 1 also comprises a bulk terminal 4.

As stated above, the physical structure is similar to that of as a conventional MOSFET, and therefore it may be fabricated using conventional MOSFET production techniques. This production compatibility is very advantageous, however alternative structure may be used, as described below.

The NRD differs significantly from a conventional MOSFET device in the manner in which it is biased. Put simply, the biasing scheme involves fixing each of the source S and the gate G at a voltage Vref with is a fixed fraction of a supply Vdd, and fixing the drain at Vdd. The bulk voltage is controlled so that it sweeps from approximately Vss (the most negative voltage available), through Vref, and towards Vdd.

In more detail, it is assumed that there is an external power supply which provides two voltages Vdd and Vss where Vdd is more positive than Vss and Vss may or may not be ground. The gate and the source are biased at a voltage between Vdd and Vss, in which the applied potential is called Vref, where Vref may or may not be ground. The drain is biased at Vdd and the bulk is swept from Vss to above Vref. The bulk current, as measured at the bulk terminal 4, exhibits a negative resistance characteristic as a function of the applied bulk voltage.

Figure 2:
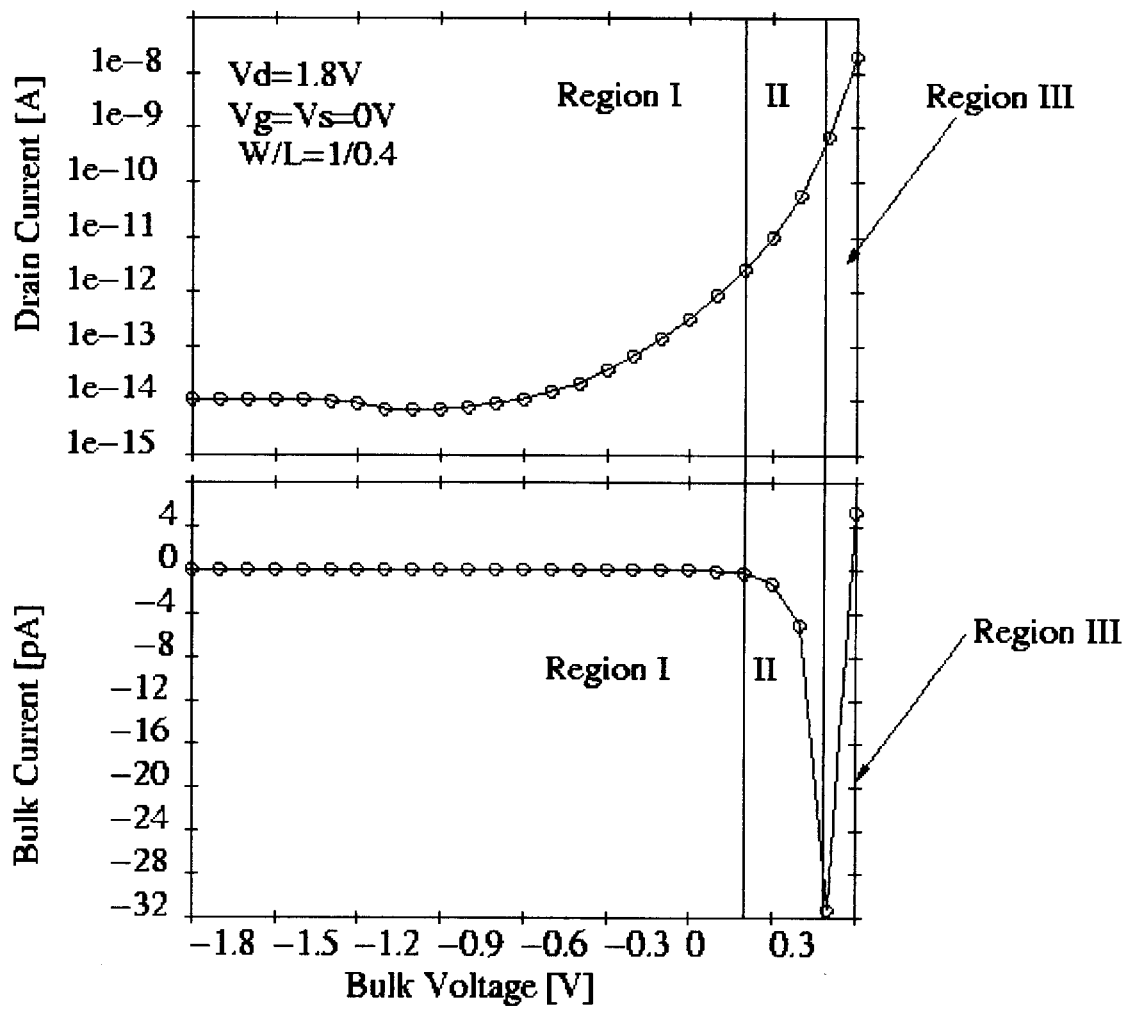
FIG. 2 is a plot of the simulated negative resistance characteristics of the device with the gate and source shorted.

FIG. 2 is a plot of simulated bulk current as a function of the bulk voltage of the device, from which it will be apparent that the device exhibits negative resistance. The applied potential values are indicated in the diagram. The structure of the simulated device is an nchannel MOSFET with length of 0.4 microns, width of ten microns and oxide thickness of 8 nm. The gate and source are grounded and the drain is at a positive voltage Vdd. The source bulk barrier height at the semiconductor surface is reduced due to depletion of carriers in the bulk at the source junction edge.

Figure 3:
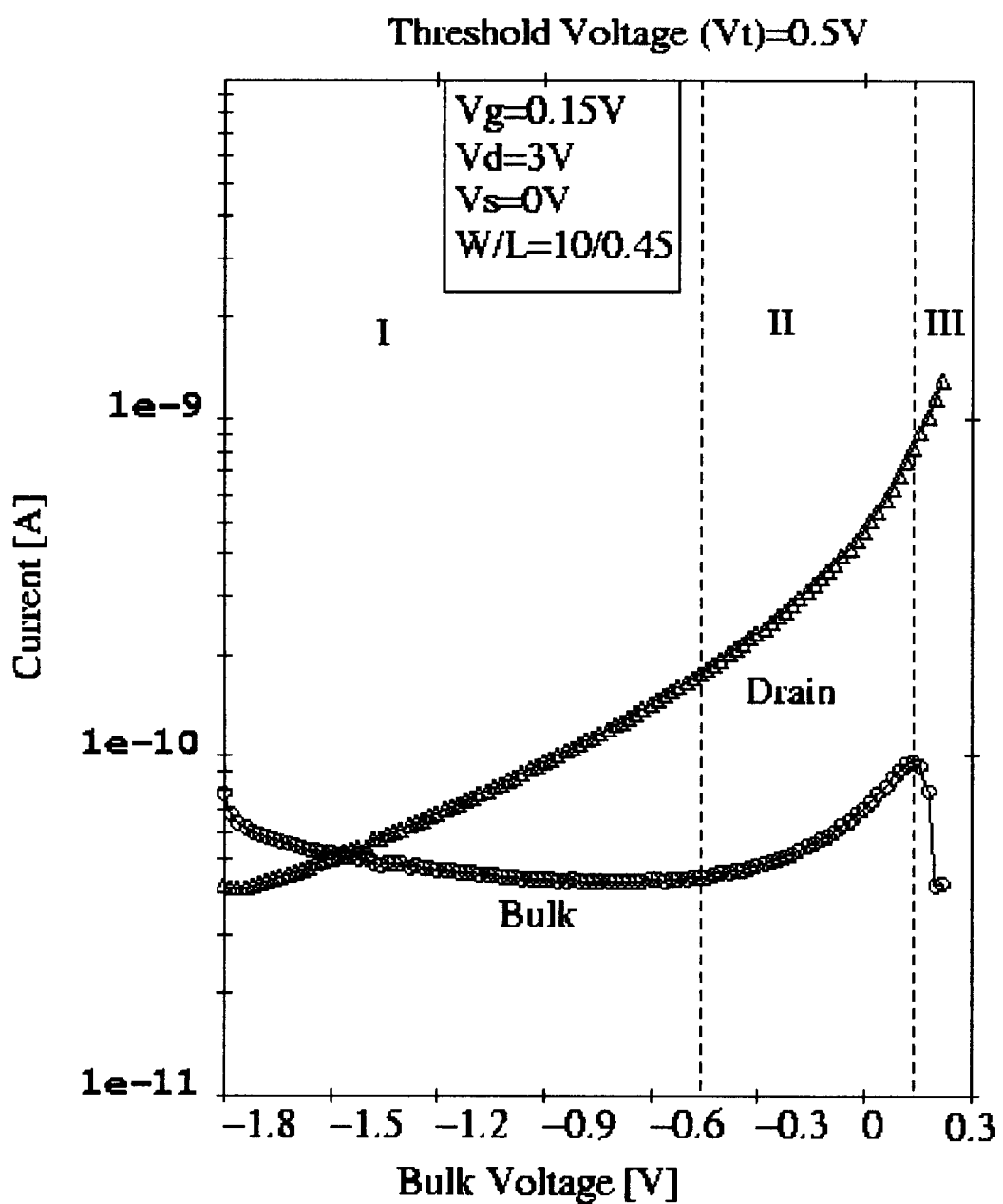
FIG. 3 is a plot of the measured negative resistance characteristics of the device with the gate voltage more positive than the source voltage.

FIG. 3 shows a plot of measured characteristics for a device having slightly different gate and source applied potentials.

The bulk current characteristic as a function of the bulk voltage can be divided into three main operating regions as follows, referring to FIG. 2.

Region I(Vbulk=Vss)

The bulk of the device is initially biased at a voltage called Vss (−3V) which is less positive than Vref. At this operation point, the bulk current comprises the source and drain diode reverse leakage currents. This current is mainly comprised of electrons and holes which are generated in the respective source and drain depletion regions. The electrons flow to the source and drain regions while the holes flow to the bulk electrode. As the bulk voltage becomes more positive, the reverse diode currents decrease due to a decrease in the reverse bias across the diodes.

Region II

As the bulk voltage approaches Vref and at a bulk voltage which is dependent on the various dopant levels, the device dimensions, and the applied biases, the reverse bias across the source/bulk junction becomes sufficiently small such that a diffusion current flows from the source to the bulk due to the reduced source barrier height at the surface. This diffusion current enters the drain/bulk depletion region where due to the applied high positive voltage on the drain (Vdd) and consequent high lateral electric field, impact ionization occurs. This impact ionization causes electron-hole pairs to be created. The generated holes flow to the bulk which causes the magnitude increase (more negative) in the observed bulk current shown in FIG. 2. This increase in the bulk current which corresponds with a decrease in the voltage across the source and drain diodes is termed negative resistance.

Region III (Vbulk>Vrej)

When the bulk voltage is more positive than Vref, a forward biased source/bulk junction causes electrons to flow to the bulk and this counteracts the holes flowing from the drain depletion region. Hence, at some bulk voltage which is dependent on the various doping levels, the device dimensions and the applied biases, the current again decreases until the currents are balanced and no bulk current flows. In this operating region, the device operates as a forward biased lateral bipolar with a forward current gain set by the doping levels of the bulk and the source. The forward current gain is defined as the (drain) collector current divided by the (bulk) base current. This gain is directly proportional to the ratio of the doping levels in the (source) emitter and (bulk) base regions. In a typical gated lateral bipolar device, the source doping is orders of magnitude higher than the bulk doping, thus leading to a high current gain which is beneficial for bipolar action.

However, this bipolar action is disadvantageous in this device as the forward-biased source bulk diode current is multiplied by the current gain so that a current which is orders of magnitude higher flows into the drain region. This causes relatively large standby power consumption which is disadvantageous for large-scale integration.

In order to decrease the standby power consumption of the device, the source doping is set at the same magnitude as the bulk doping. In a CMOS process, this is achieved by masking the source region during the high energy source implant. This sets the lateral bipolar current gain to be approximately unity which in turn reduces the power consumption of the device by orders of magnitude.

With a high source doping, the power consumption of the device can be of the order of nW whereas decreasing the source doping to the same as the bulk doping reduces the power substantially below 1 pW for a 0.4 µm minimum feature device. This power can be further reduced by modifying the geometry of the structure which includes the geometry, doping levels and materials of each region and the permittivity and thickness of the insulator such that the surface diffusion current is minimised whilst providing sufficient current to generate the negative resistance in the bulk of the device.

The NRD has applications in many different areas of semiconductor technology. In particular, the applications include the following areas:

Memory

Microwave oscillators

Pulse generators

Amplifiers

Logic functions

Three memory circuits using the NRD are described below. All of these circuits are based on the negative resistance characteristics of the device.

Figure 4:
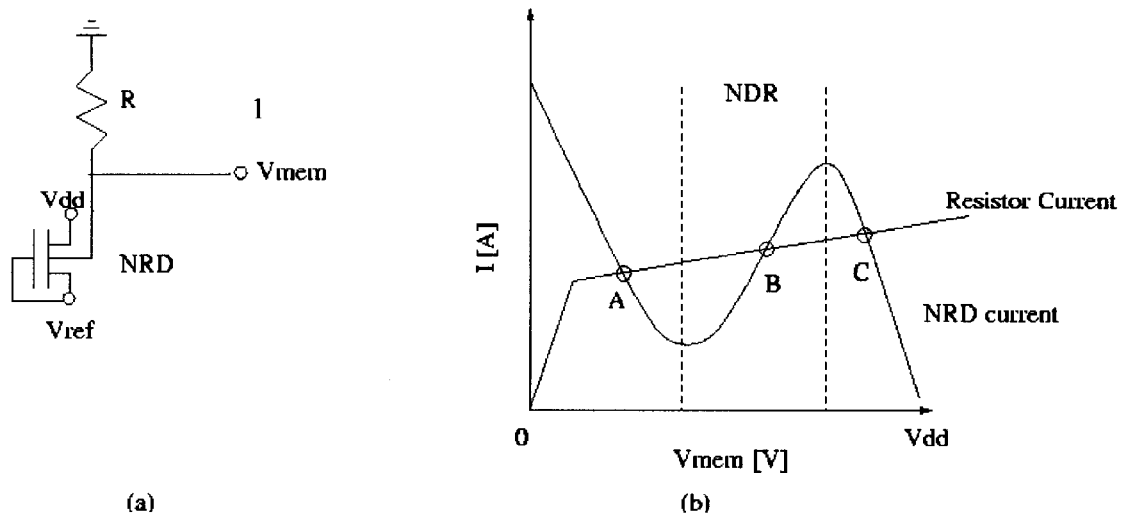
FIG. 4(a) is a diagram showing a memory circuit incorporating the device.
FIG. 4(b) is a I-V plot showing stable memory states.

Referring to FIG. 4(a) there is illustrated a memory circuit with a p-type NRD and a resistor connected between ground and the bulk and where the gate and source of the NRD are tied to a reference voltage Vref which is between ground and the drain potential. More generally, the resistor may be any element having a positive resistance characteristic connected between the bulk and a terminal with fixed potential. The fixed potential should be equal to or less positive than the source potential for p-type bulk NRD and equal to or more positive than the source potential for n-type bulk NRD. The circuit also works using n-type NRD by changing the applied biases to the NRD. The drain of the NRD is at the most negative voltage Vss and the reference voltage is between the applied drain potential and the fixed potential which may or may not be ground.

The memory shown in FIG. 4(a) is capable of two distinct stable states, A and C shown in FIG. 4(b). The operating point is determined from the resistor load-line and the NRD bulk I–V characteristic. This knowledge is used in each of the following circuits in order to realise a Static Random Access Memory cell using the NRD.

Figure 5:
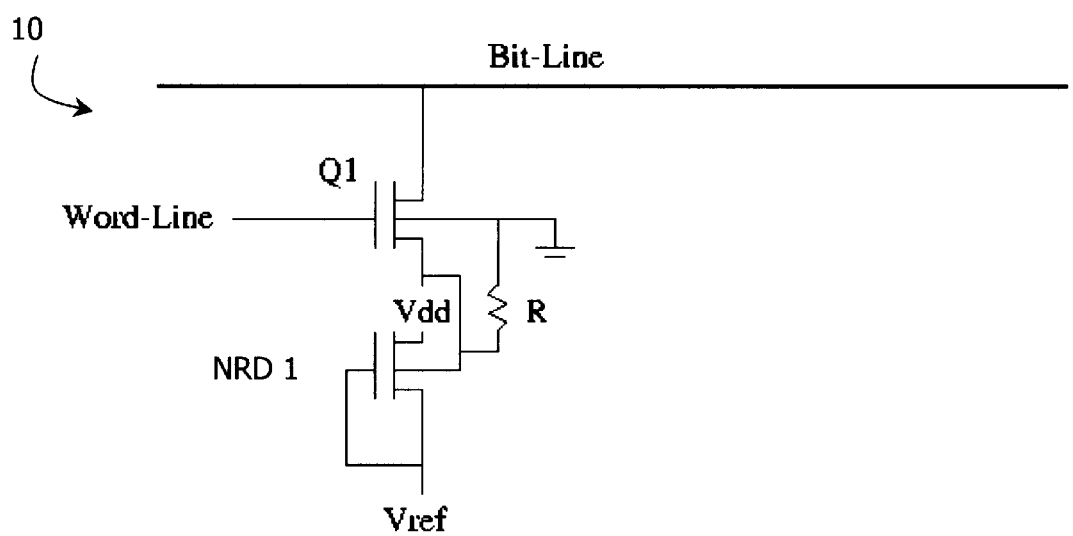
FIG. 5 is a circuit diagram of a three element.

FIG. 5 shows a one transistor, one-resistor and one-NRD memory circuit 10 which allows writing and reading of two distinct voltages onto the bulk of the NRD through an access transistor Q1. These voltages are stored at that node due to a resistor R and the negative resistance operation of the NRD as described above. This memory is static and does not need refresh but the memory state needs to be rewritten after each read operation. The access transistor must have the same bulk type as the NRD in this arrangement i.e. for a p-type bulk NRD, a p type bulk access transistor (more commonly called an nchannel MOSFET) is needed.

Figure 6:
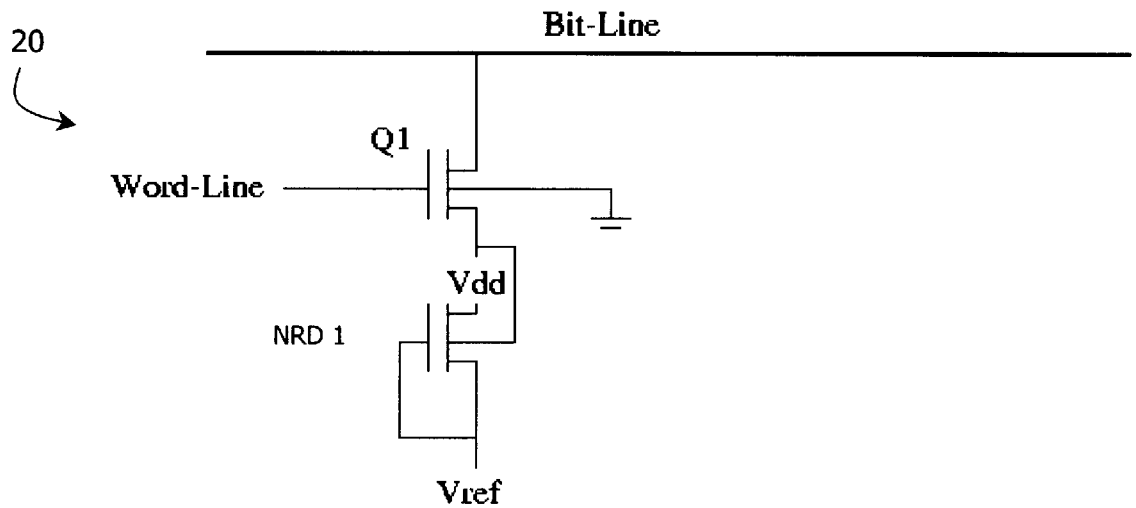
FIG. 6 is a diagram showing a two-element SRAM.

FIG. 6 shows a one-transistor (Q1) and one NRD SRAM circuit 20 which allows writing and reading of two distinct memory states through an access transistor Q1. The load-line for the NRD is provided by the leakage current flowing through the source of the access transistor Q1. This memory is static and does not need refresh but the memory state needs to be rewritten after each read operation.

Figure 7:
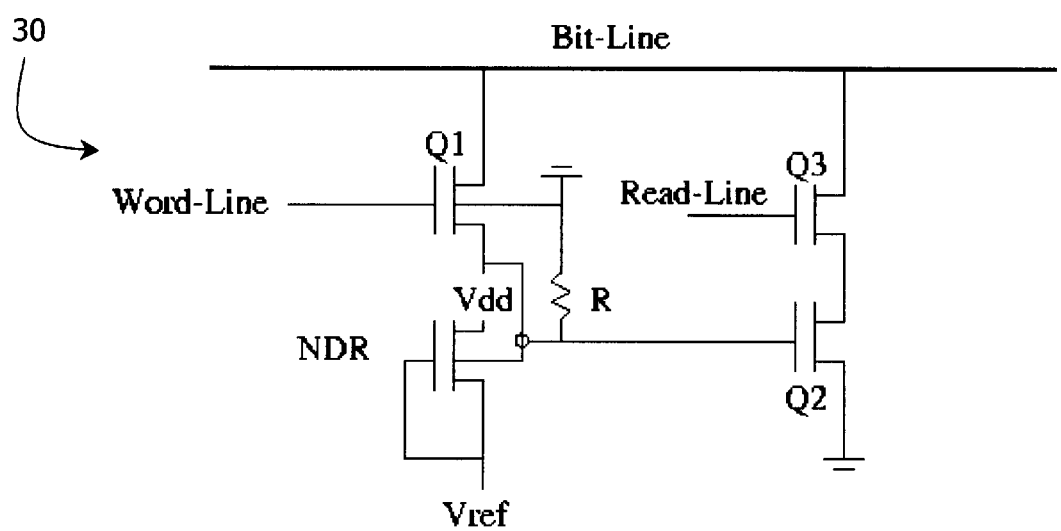
FIG. 7 is a diagram showing a five-element SRAM.

FIG. 7 shows a three-transistor (Q1–Q3) and one NRD 1 and one-resistor (R) static random access memory circuit 30 which does not require the state to be rewritten after a read. Hence, this memory is considerably faster than the previous two circuits described but at the penalty of a higher cost/bit. This memory is expected to be as fast as present-day SRAM but uses five components instead of six. The resistor may be removed and replaced by the reverse biased source diode of the access transistor Q1 as illustrated in FIG. 6.

It will be appreciated that the invention avoids the problems of the prior approaches, which use a MOSFET operating in saturation mode to supply a channel current which causes the impact ionization near the drain edge. In the nMOSFET saturation mode, part of the p-type bulk under the channel is inverted to n-type due to a high positive gate-source voltage. The surface current is very large (1 µA–1 mA) and is due to a drift mechanism. These current levels lead to high standby power consumption and inherent reliability hazard relative to the device. The reliability hazard is due to a significant number of carriers that enter the oxide and cause traps which ultimately degrades the device characteristics. In our invention, no part of the bulk is inverted and there is no formation of a channel under the gate region. The generating mechanism is due to diffusion of carriers at the surface. The standby power consumption is extremely low (pW) and consequently there is no impediment for integrating millions of such devices in a memory array. Neither is there a reliability hazard as there are no significant currents flowing in the device.

The source and gate are not necessarily shorted together, however the potential difference should not be greater than the structure threshold. The threshold of a MOSFET structure as shown in FIG. 1 and with zero back bias (reverse bias between bulk and source) is defined as the applied voltage difference between the gate and source at which the channel inverts and the drain current is primarily due to a drift mechanism. For nMOSFETs, the value of the threshold voltage is typically 0.5V whereas it is −0.5V for a pMOSFET.

With particular load-lines provided by devices such as reverse biased diodes, a stable state may not be present in Region I. Hence, Region I is not needed for the circuit to operate as a latch. In these cases, there can be two states in Region II and one state in Region III and two of these states are stable and one unstable as described above.

When integrating a number of such devices on a single substrate, the area of the individual bulk regions needs to be minimised. An advantageous technology for this purpose is Silicon on Insulator Technology, in which the devices are manufactured on an insulating substrate and the bulk of each device is totally isolated from other elements on the substrate.

Figure 8A:
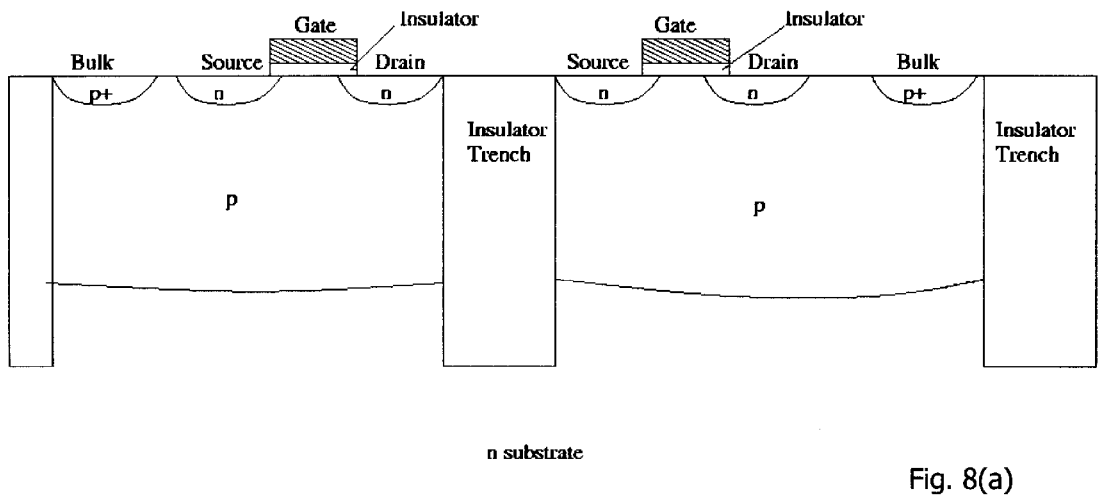
FIG. 8(a) is a side view of an alternative structure and FIGS. 8(b) and 8(c) are plan views of further alternative structures.

In standard CMOS bulk technology, trench isolation should be used to isolate the bulk of the NRD element from other elements in the array as shown in FIG. 8(a). The depth of the bulk region should be minimised in order to reduce the depth of the trenches required. In this configuration, the substrate is of opposite type to the bulk region and should always be reverse biased in order to prevent latchup and cross-talk between NRD elements. It is noted that the trench depth exceeds the depth of the bulk region. However, this might not be possible in some particular bulk CMOS technologies and therefore the distance between the bulk regions should be sufficient such that there is no latchup or cross-talk problems. Another way to reduce the potential of latchup or cross-talk is to increase the dopings of the bulk and the substrate so as to reduce the lateral spreading of the bulk regions.

Figure 8B:
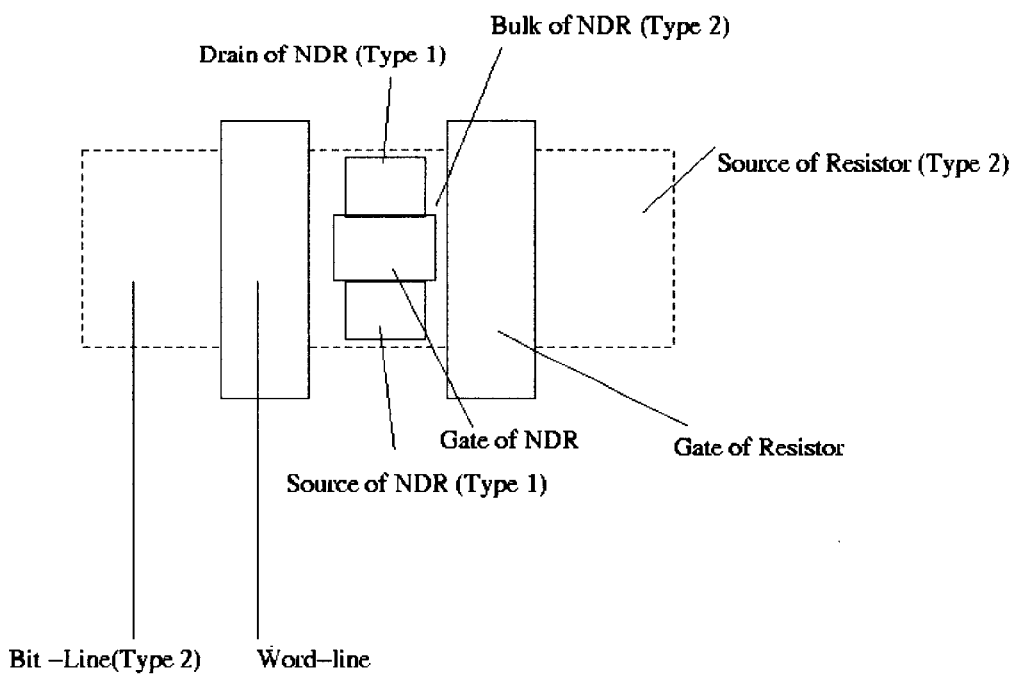

An arrangement to fabricate the memory circuit of FIG. 5 such that the source of the access transistor also acts as the bulk of the NRD and the drain of a load transistor (which provides the resistive load line) is illustrated in FIG. 8(b).

Figure 8C:
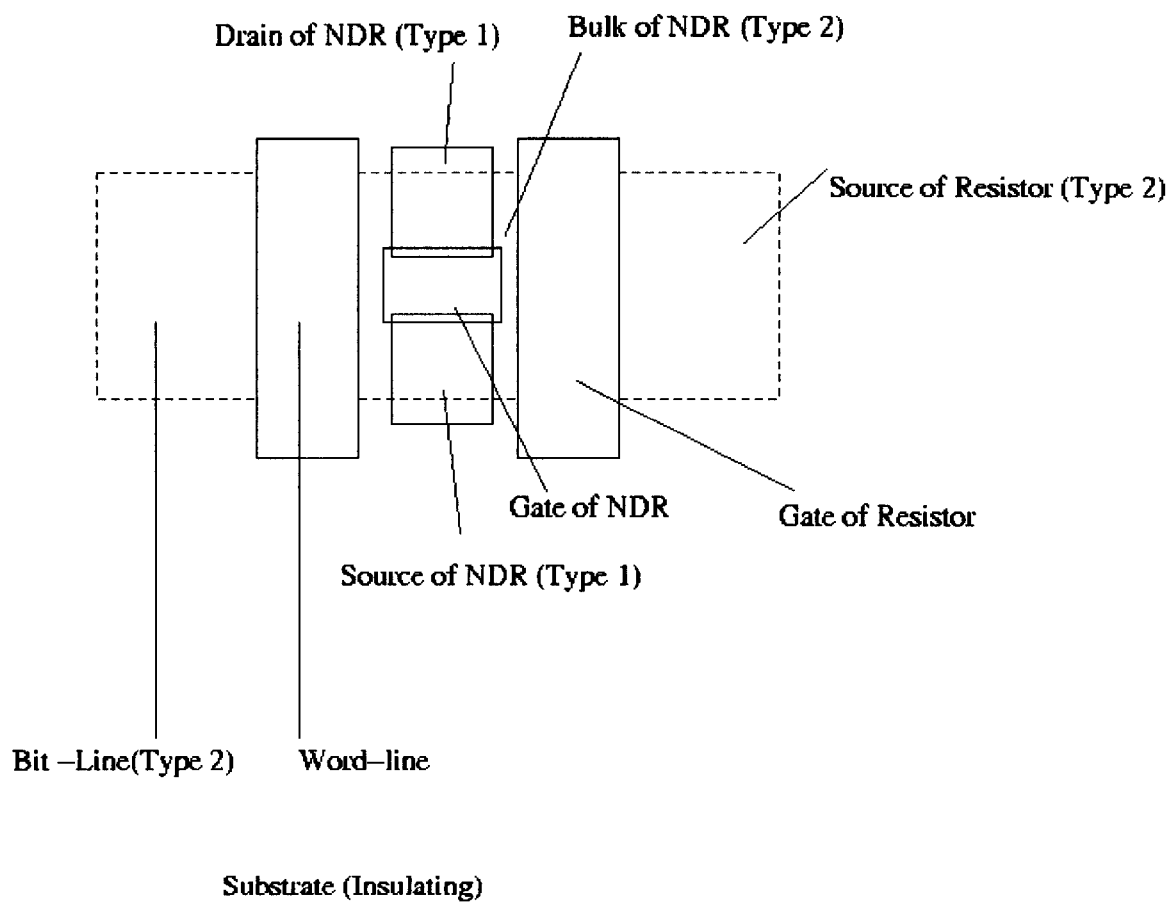

The substrate is of one conductivity type and the bulk of the NRD is of a second conductivity type. Of course, this arrangement applies equally well to Silicon On Insulator (SOI) technology where the substrate is insulating. In the case of the SOI implementation, the source and drain of the NRD need not be totally enclosed by the bulk of the NRD. Indeed, in the case of a fully depleted SOI, the bulk of the NRD can be totally enclosed by the source and drain regions as illustrated in FIG. 8(c).

The invention is not limited to the embodiments described, but may be varied in construction and detail within the scope of the claims. For example, the resistor R of FIGS. 5 to 7 may be replaced by any element which exhibits a positive resistance characteristic. In addition, any means for applying a potential to the bulk of the NRD can be used. The material and doping of the semiconductor regions may be varied and the insulating region may be fabricated using any insulating material and the gate region may be of conducting or semiconducting material

What is claimed is:

1. A negative resistance device comprising:
   a semiconductor structure comprising a semiconductor region of one conductivity type termed the bulk, a semiconductor region of second conductivity type termed the source wholly or partially contained in the bulk, a semiconductor region of second conductivity type termed the drain wholly or partially contained in the bulk, and a gate over at least part of the bulk and being insulated from the bulk;
   a bias means comprising means for biasing the structure to exhibit negative resistance characteristics, in which
   the source and the gate are each held at a fixed applied potential with respect to a bulk initial bias, and the gate to source applied potential difference is not greater than the threshold voltage of the structure;
   the drain is held at a fixed applied potential which is of greater magnitude than both the gate applied potential and the source applied potential; and
   a variable bias potential is applied to the bulk so that as it is swept towards the source applied potential the bulk current exhibits a negative resistance characteristic.

2. A device as claimed in claim 1, wherein the source and the gate have the same applied voltage.

3. A device as claimed in claim 1, wherein the semiconductor structure is a MOSFET structure.

4. A device as claimed in claim 1, wherein the structure is fabricated using silicon-on-insulator techniques.

5. A device as claimed in claim 1, wherein source doping is equivalent to doping in the bulk so that lateral bipolar current gain is unity.

6. A device as claimed in claim 1, wherein the gate is of polysilicon material and is doped with an equivalent level to that of the source.

7. A memory circuit comprising (a) a negative resistance device as claimed in claim 1 and (b) an element which exhibits a positive resistance characteristic connected between the bulk of the device and a terminal having a fixed potential so that two states of the memory circuit at which the current through the resistor matches that through the bulk of the device are stable states for bistable memory operation.

8. A memory circuit as claimed in claim 7, wherein the bias means comprises an access transistor for the bulk terminal.

9. A memory circuit as claimed in claim 8, wherein the source diode of the access transistor acts as the positive resistance element.

10. A memory circuit as claimed in claim 8, wherein the access transistor is of the type having a source, a drain, a gate, and a bulk, the circuit further comprises a load transistor providing a resistive load line, and the source of the access transistor also acts as the bulk of the negative resistance device and the drain of the load transistor.

11. A memory circuit as claimed in claim 10, wherein said circuit is fabricated on a substrate having a conductivity type different from that of the bulk of the negative resistance device.

12. A memory circuit as claimed in claim 10, wherein said circuit is fabricated using Silicon On Insulator Techniques.

13. A memory circuit as claimed in claim 7, wherein the means of biasing the bulk of the negative resistance device are different from means of detecting the stored potential in the memory.

14. A memory circuit as claimed in claim 13, wherein means for reading the stored potential is a gain stage.

* * * * *